(12) United States Patent  (10) Patent No.: US 7,757,139 B2
Hua  (45) Date of Patent: Jul. 13, 2010

(54) BOUNDARY SCAN METHOD, SYSTEM AND DEVICE

(75) Inventor: Sizhen Hua, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 12/361,967

(22) Filed: Jan. 29, 2009

(65) Prior Publication Data

US 2009/0138771 A1 May 28, 2009

Related U.S. Application Data

(63) Continuation of application No. PCT/CN2007/000255, filed on Jan. 23, 2007.

(30) Foreign Application Priority Data

Aug. 17, 2006 (CN) .................... 2006 1 0111250

(51) Int. Cl.
G01R 31/28 (2006.01)
(52) U.S. Cl. ................................ 714/727
(58) Field of Classification Search ............... 714/727
See application file for complete search history.

(56) References Cited

U.S. PATENT DOCUMENTS

| 5,515,505 | A | 5/1996 | Ishizuka | |
|---|---|---|---|---|
| 6,931,344 | B2 * | 8/2005 | Gotoh et al. | 702/117 |
| 6,990,618 | B1 * | 1/2006 | Lulla et al. | 714/727 |
| 7,088,091 | B2 * | 8/2006 | Abdennadher | 324/158.1 |
| 7,089,463 | B1 | 8/2006 | Baeg et al. | |
| 7,098,682 | B2 * | 8/2006 | Sasaki | 324/765 |
| 7,139,957 | B2 * | 11/2006 | Querbach et al. | 714/745 |
| 7,428,678 | B1 * | 9/2008 | Berndt et al. | 714/729 |
| 7,487,412 | B2 * | 2/2009 | Baeg et al. | 714/712 |
| 2002/0120895 | A1 | 8/2002 | Suzuki | |
| 2002/0170011 | A1 | 11/2002 | Lai et al. | |
| 2005/0172190 | A1 | 8/2005 | Liang | |
| 2006/0123294 | A1 | 6/2006 | Vu | |

FOREIGN PATENT DOCUMENTS

| CN | 1763556 A | 4/2006 |
|---|---|---|
| CN | 100487473 C | 5/2009 |
| EP | 1 348 971 A1 | 10/2003 |
| KR | 2006-0055595 A | 5/2006 |

OTHER PUBLICATIONS

Andrews, "Integration of IEEE 1149.1 with Mixed ECL, TTL, and Differential Logic Signals," *Proceeding of European Test Conference (IEEE)*, 355-360 (Apr. 1993).
PCT Written Opinion of the International Searching Authority (May 17, 2007).

* cited by examiner

*Primary Examiner*—James C Kerveros
(74) *Attorney, Agent, or Firm*—Leydig, Voit & Mayer, Ltd.

(57) ABSTRACT

A boundary scan method, including generating a first parallel unipolarity boundary scan signal by a scan signal generation apparatus, sending the first parallel unipolarity boundary scan signal to a boundary scan controller; and converting, by the boundary scan controller, the first parallel unipolarity boundary scan signal into a serial boundary scan signal in a differential signaling form, and using the serial boundary scan signal for scanning a boundary scan device connected between a scan signal output and a scan signal input of the boundary scan controller.

12 Claims, 5 Drawing Sheets

BOUNDARY SCAN METHOD, SYSTEM AND DEVICE

CROSS-REFERENCE TO RELATED APPLICATIONS

This application is a continuation of International Patent Application No. PCT/CN2007/000255, filed Jan. 23, 2007, which claims priority to Chinese Patent Application No. 200610111250.8, filed Aug. 17, 2006, both of which are hereby incorporated by reference in their entirety.

FIELD OF THE INVENTION

The present invention relates to circuit scan technologies and in particular to a boundary scan method, system and device.

BACKGROUND OF THE INVENTION

With the development of printed circuit board and large scale integrated circuit technologies, printed circuit boards become more and more complicated with an increasing number of pins of elements and an increasing density of the pins, so that it becomes more and more difficult to contact a test point with a probe of a multimeter or an oscillograph, and the cost thereof is becoming increasingly higher. Some companies in the North America established the Joint Test Action Group (JTAG) and drafted the Boundary Scan Testing (BST) specification in the year of 1988, and the specification was approved as the 1149.1 standard by the Institute of Electrical and Electronic Engineers (IEEE) in the year of 1990.

The boundary scan technology exerts full control on a pin of a boundary scan device by software to set or read its status. FIG. 1 illustrates a schematic diagram of a structure of a boundary scan device 100, wherein a logic 1040 is an original logic function module inside the device 100; Input/Output (I/O) pins 1002-1007 of the device each correspond to a boundary scan unit 1010-1015; each boundary scan unit is arranged between a external pin and a internal logic function module of a chip and the units are connected in series inside the device to form a boundary scan chain. When the device operates normally, a boundary scan function is disabled, the boundary scan unit is "transparent", and the logic function module inside the device can be operated normally through the device pins. After a dedicated Test Access Port (TAP) controller 1020 inside the device is controlled with by using a Test Clock Input (TCK) 1000 and a Test Mode Select Input (TMS) 1009 to enable the boundary scan function, status of each pin in any boundary scan unit can be read or set through the boundary scan chain, therefore it is possible to perform a test of a circuit inside or outside the device by a dedicated test software.

FIG. 2 illustrates a schematic diagram of performing a boundary scan of a plurality of test devices by a boundary scan controller 22. The boundary scan controller 22 is connected with a scan signal generation apparatus 20 via a PCI interface, a USB interface, a network interface, etc., and is adapted to convert parallel test data sent from the scan signal generation apparatus 20 into serial test data identifiable by the boundary scan controller 22 while generating a clock signal TCK and a status control signal TMS which are transferred together with TDI via an interface unit to boundary scan devices 24 to be tested. The boundary scan controller 22 receives a TDO signal from the boundary scan devices 24 to be tested via the interface unit.

The boundary scan devices 24 to be tested are connected in the form of chain through Test Data Inputs (TDI) and Test Data Outputs (TDO), that is, the TDO of a first device 100-1 is connected with the TDI of a second device 100-2; the TDO of the second device 100-2 is connected with the TDI of a third device 100-3; and so on. The test data of the boundary scan controller is input to the TDI of the first device 100-1, then serial-to-parallel conversion is performed in the first device 100-1, afterwards it passes through each boundary scan unit sequentially, finally parallel-to-serial conversion is performed and then it goes from the TDO into the TDI of the second device 100-2 for the identical processing. The Test Clock Signal (TCK) and the Test Mode Signal (TMS) of the boundary scan controller 22 are input respectively to the TCK and the TMS of each device.

The boundary scan technology is initially used for circuit connection test, generally the scale of the test is not big, and the boundary scan speed is not high but acceptable in view of a short period of time for a round of the scan test. In recent years, the application scope of the boundary scan technology has been extended gradually to the fields of online programming of nonvolatile devices and online simulation and diagnosis due to its uniqueness, which will be described briefly below.

Online programming of nonvolatile devices is implemented by making use of the feature that a boundary scan is capable of controlling the status of an I/O pin arbitrarily, the boundary scan controller performs online programming of a nonvolatile device, i.e., a FLASH, a Complex Programmable Logic Device (CPLD), etc., by controlling the status of an I/O pin of a boundary scan device. In online programming of the nonvolatile device, the boundary scan device is interconnected with the Flash device, and complete simulation of Flash programming timing under the control of boundary scan signals output from the boundary scan controller is able to write desired data into the Flash device and thereby finish the programming, and to retrieve the data for a check. In this way, it is not necessary for any function inside the device to participate, and the device can be programmed with high reliability as long as it is in proper connection. However a low speed of programming may result from a large number of I/O pins of the boundary scan device due to serial input and output of the test data.

In analogy to the above online programming procedure, online simulation and diagnosis make use of the feature of a boundary scan to set or read statuses of a set of signals in a system to thereby simulate and diagnose a specific function.

The boundary scan controller in the conventional techniques drives a Transistor-Transistor Logic (TTL) level signal or a Complementary Metal-Oxide-Semiconductor Transistor (CMOS) signal. However, it is required to connect a boundary scan signal to a plurality of devices for a boundary scan of the devices, thereby requiring a long wiring line with numerous branches; the TTL signal and the CMOS signal are single-end signals and only one signal line is required in the transmission circuit; external interferences may be superimposed directly over the single-end signal line and the single-end transmission signal line may also eradiate more interferences outward; and the single-end signal is more easily subject to interference in the case of a long transmission distance. Furthermore, a common ground plane is used as a signal returning channel for single-end transmission, and various interferences over the ground plane may have direct influences on signal transmission. Consequently using the TTL signal or the CMOS signal as a boundary scan signal may cause a considerable crosstalk among signals, a poor anti-interference capability and a slow speed of the boundary scan.

SUMMARY OF THE INVENTION

Embodiments of the invention provide a boundary scan method, system and device to address the problem of a slow boundary scan speed caused by the deficiencies of conventional boundary scan techniques.

An embodiment of the invention provides a boundary scan method including: (1) generating a parallel unipolarity boundary scan signal, by a scan signal generation apparatus; (2) sending the parallel unipolarity boundary scan signal to a boundary scan controller; (3) converting, by the boundary scan controller, the parallel unipolarity boundary scan signal into a serial differential boundary scan signal; and (4) scanning a boundary scan device connected between a scan signal output and a scan signal input using the serial differential boundary scan signal.

An embodiment of the invention provides a boundary scan system including: (1) a scan signal generation apparatus adapted to generate a parallel unipolarity boundary scan signal; (2) a boundary scan controller adapted to convert the parallel unipolarity boundary scan signal into a serial differential boundary scan signal, and scan a boundary scan device connected between a scan signal output and a scan signal input via the serial differential scan signal; and (3) the boundary scan device adapted to convert the serial differential boundary scan signal into a unipolarity boundary scan signal, transmit the unipolarity boundary scan signal to a boundary scan chain of the boundary scan device for scanning the scan chain, and convert the unipolarity boundary scan signal into a differential boundary scan signal and transmit the differential scan signal to a next scan signal input.

An embodiment of the invention provides a boundary scan controller including: (1) a data format conversion module, adapted to convert a parallel boundary scan signal output generated by a scan signal generation apparatus into a serial unipolarity boundary scan signal; and (2) a scan signal drive module, adapted to transmit the serial unipolarity boundary scan signal in a differential signaling form, and scan a boundary scan device connected between a scan signal output and a scan signal input of the boundary scan controller using the serial unipolarity boundary scan signal in the differential signaling form.

An embodiment of the invention provides a boundary scan device including: (1) a scan signal reception module, arranged at a scan signal input of the boundary scan device, adapted to convert a differential boundary scan signal into a unipolarity boundary scan signal and transmit the unipolarity boundary scan signal to a boundary scan chain of the boundary scan device for scanning the boundary scan chain; and (2) a scan signal output module, arranged at a scan signal output of the boundary scan device, adapted to transmit the unipolarity boundary scan signal to the next scan signal input in the differential signaling form.

In the embodiments of the invention, the boundary scan signals are transmitted in the differential signaling form between the respective components of the boundary scan system, and since a differential signal is an anti-interference high-speed signal, the speed of the boundary scan can be improved greatly while interference in the boundary scan is reduced. Therefore, the efficiency of programming, diagnosing and testing the boundary scan devices is improved.

DETAILED DESCRIPTION OF THE INVENTION

Figure 1:
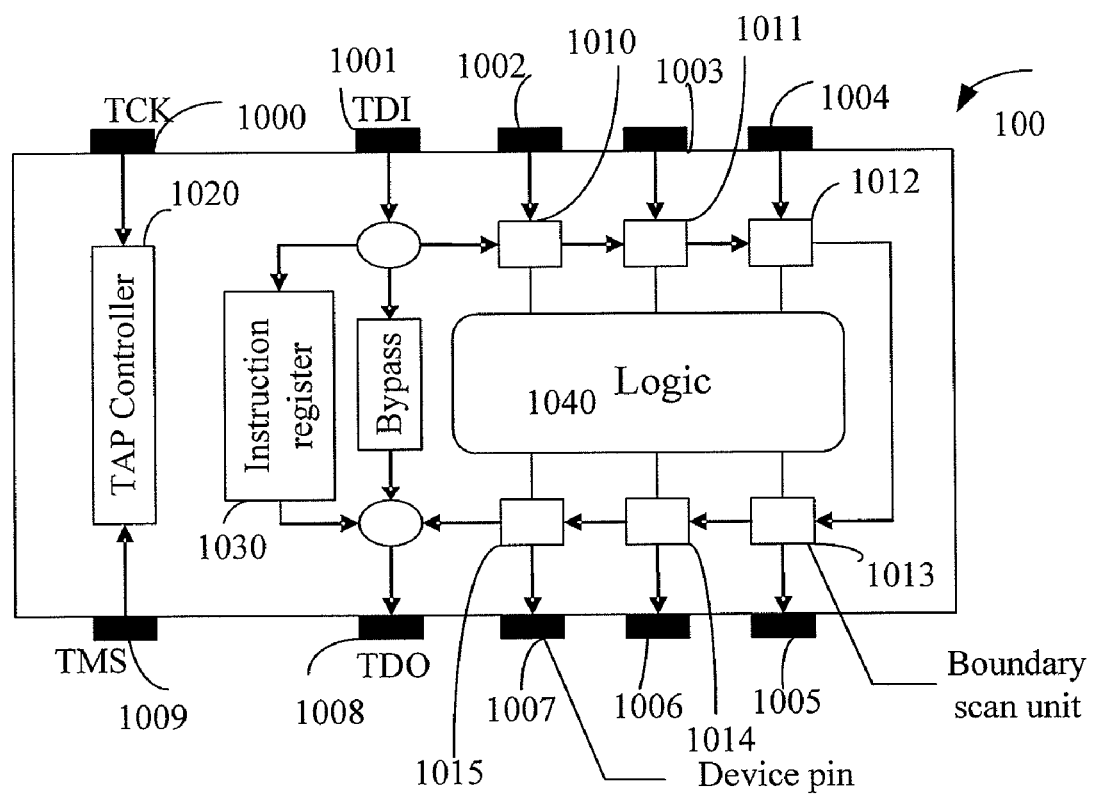
FIG. 1 illustrates a schematic diagram of an operation principle of a boundary scan.
Figure 2:
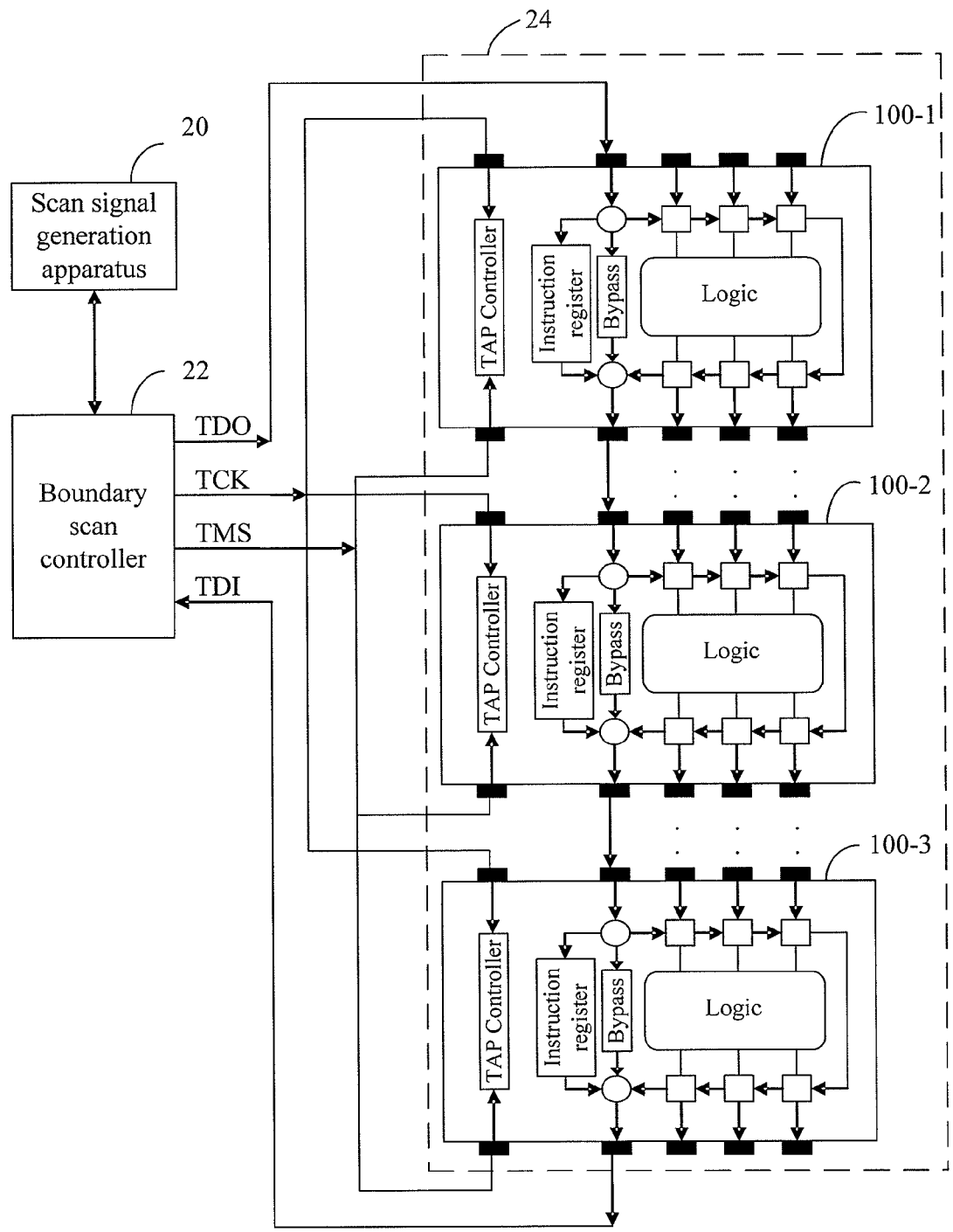
FIG. 2 illustrates a schematic diagram of a boundary scan of a plurality of boundary scan device.

A general implementation principle, specific implementations and advantageous effects that can be attained correspondingly of the embodiments of the invention will be set forth in details hereinafter with reference to the respective figures in the drawings.

Figure 3:
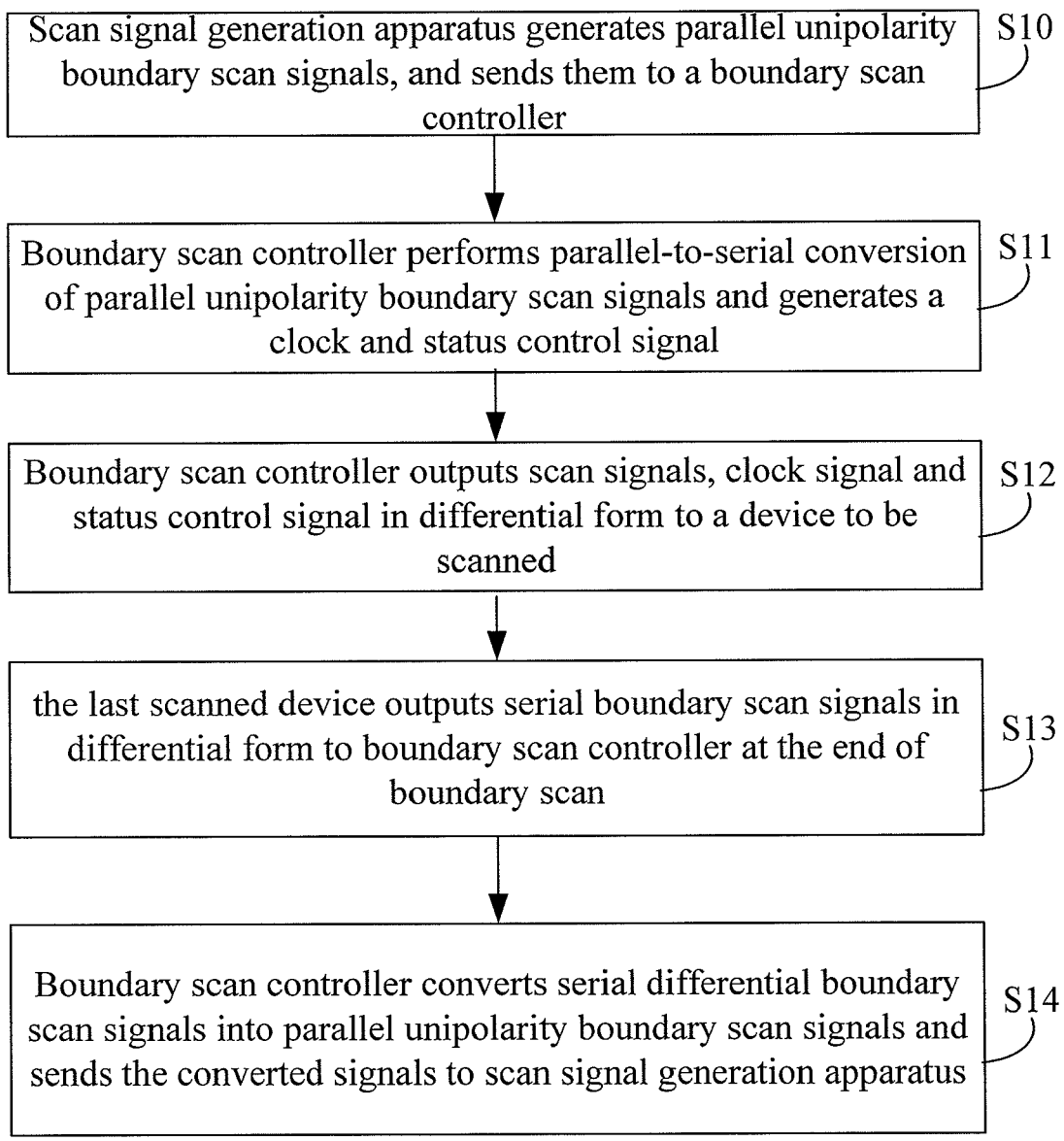
FIG. 3 illustrates a flow chart of a boundary scan method according to an embodiment of the invention.

Referring to FIG. 3, it illustrates a flow chart of a boundary scan method according to an embodiment of the invention, which generally includes the following steps:

In step S10, a scan signal generation apparatus generates first parallel unipolarity boundary scan signals, and sends them to a boundary scan controller.

In step S11, the boundary scan controller performs parallel-to-serial conversion of the first parallel unipolarity boundary scan signals output from the scan signal generation apparatus and generates a clock signal and a status control signal in accordance with the received first parallel boundary scan signals.

In step S12, the boundary scan controller outputs serial differential unipolarity boundary scan signals obtained from the conversion to a first one of boundary scan devices connected sequentially between an output and an input of scan signals of the boundary scan controller, and outputs the generated clock signal and status control signal in the differential signaling form respectively to a clock signal input and a status control signal input of each of the boundary scan devices connected sequentially between the output and the input of scan signals of the boundary scan controller.

The first boundary scan device converts the received differential boundary scan signals into unipolarity boundary scan signals, inputs the converted signals into its own internal boundary scan chain and transmits the differential boundary scan signals which have finished the scan of boundary scan chain to the next scan signal input. In this way the boundary scan is performed sequentially for the boundary scan devices connected sequentially between the output and the input of scan signals of the boundary scan controller.

The boundary scan devices converts the received clock signal and status control signal in the differential signaling form into unipolarity signals and inputs the converted signals into their own internal circuits.

In step S13, after finishing the boundary scan of all the boundary scan devices connected sequentially between the output and the input of scan signals of the boundary scan controller by the boundary scan signal, the serial differential boundary scan signals are output from the scan signal output of the last one of the boundary scan devices connected sequentially between the output and the input of scan signals of the boundary scan controller to the input of scan signals of the boundary scan controller.

In step S14, the boundary scan controller converts the serial differential boundary scan signals received via the scan signal input into second parallel unipolarity boundary scan signals and sends it to the scan signal generation apparatus, thereby finishing the boundary scan of all the boundary scan devices connected sequentially between the output and the input of scan signals of the boundary scan controller.

In correspondence with the above boundary scan method according to the embodiment of the invention, embodiments of the invention further provide a corresponding boundary scan system, a boundary scan controller and a boundary scan device.

Figure 4:
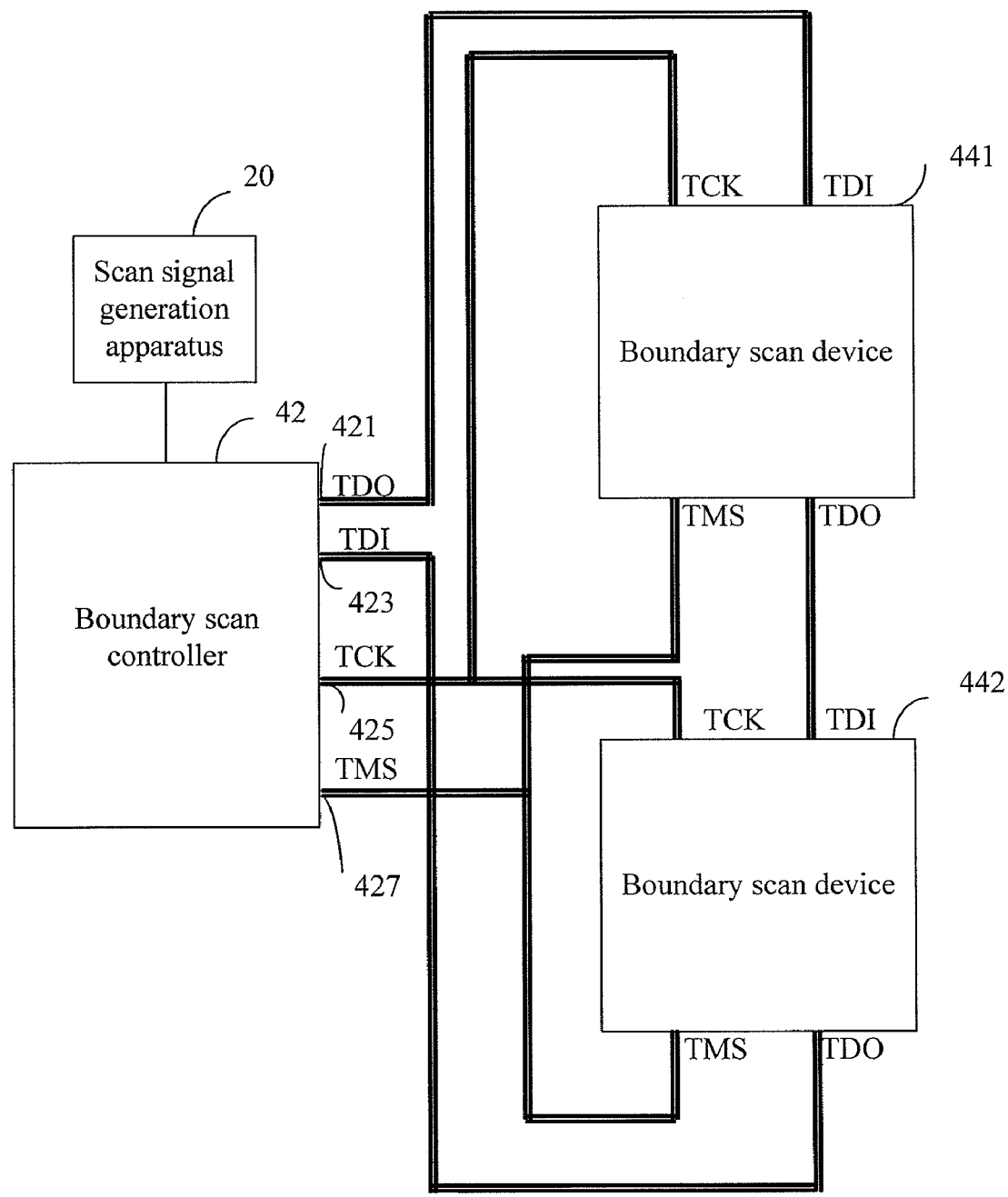
FIG. 4 illustrates a block diagram of the structure of a boundary scan system according to an embodiment of the invention.

Referring to FIG. 4, it illustrates a block diagram of the structure of a boundary scan system according to an embodiment of the invention, which generally includes a scan signal generation apparatus 20, a boundary scan controller 42 and at least one boundary scan device 441, and primary function of the respective components of the boundary scan system will be described in details below.

The scan signal generation apparatus 20 is adapted to generate parallel first unipolarity boundary scan signals.

The boundary scan controller 42 is adapted to convert the boundary scan signals generated by the scan signal generation apparatus 20 into serial differential boundary scan signals, use the boundary scan signals obtained from the conversion for a boundary scan of the boundary scan device 441 connected between a scan signal output 421 and a scan signal input 423, convert the boundary scan signals returned from the scan signal input into second parallel unipolarity boundary scan signals, and send the converted signals to the scan signal generation apparatus 20.

The boundary scan devices 441, 442 connected sequentially between the scan signal input 423 and the scan signal output 421 of the boundary scan controller are adapted to receive the serial differential boundary scan signals output from a previous scan signal output, convert the received signals into serial unipolarity boundary scan signals, input the converted signals into its own internal boundary scan chain, and transmit the serial boundary scan signals which have finished the scan of the differential boundary scan chain to the next scan signal input.

Preferably, the boundary scan controller 42 generates a clock signal and a status control signal while performing the parallel-to-serial conversion of the first parallel boundary scan signals generated by the scan signal generation apparatus 20, and outputs the generated clock signal and status control signal in the differential signaling form respectively to a clock signal input and a status control signal input of each boundary scan device sequentially connected between the scan signal output and the scan signal input.

The boundary scan devices 441, 442 convert the received clock signal in differential signaling form into a unipolarity clock signal and the received status control signal in differential signaling form into a unipolarity status control signal.

Figure 5:
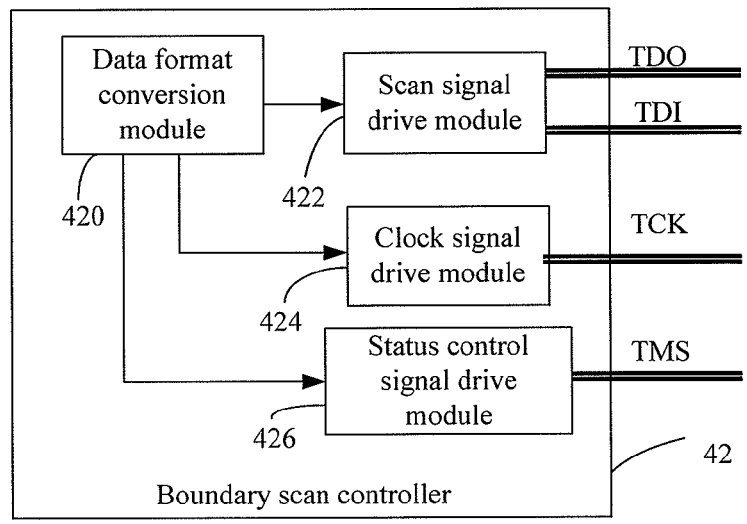
FIG. 5 illustrates a block diagram of the structure of a boundary scan controller according to an embodiment of the invention.

Referring to FIG. 5, it illustrates a block diagram of the structure of a boundary scan controller 42 according to an embodiment of the invention, which generally includes a data format conversion module 420 and a scan signal drive module 421, wherein.

The data format conversion module 420 is adapted to perform parallel-to-serial conversion of the first parallel unipolarity boundary scan signal output from a scan signal generation apparatus, generate a clock signal and a status control signal in accordance with the received first parallel boundary scan signals, perform serial-to-parallel conversion of serial unipolarity boundary scan signals sent from the scan signal drive module 422, and send the second parallel boundary scan signals obtained from the conversion to the scan signal generation apparatus.

The scan signal drive module 422 is adapted to output the serial differential unipolarity boundary scan signals to a scan signal input of the first one of sequentially connected boundary scan devices, perform sequentially boundary scan of the boundary scan devices connected sequentially between a scan signal output and a scan signal input of the boundary scan controller, convert the serial differential boundary scan signals output from a scan signal output of the last one of the boundary scan devices into serial unipolarity boundary scan signals, and send the converted signals to the data format conversion module 420.

Wherein the differential signaling form adopted for the boundary scan signals is Low-Voltage Differential Signaling (LVDS) or Bus Low-Voltage Differential signaling (BLVDS).

Preferably, the boundary scan controller 42 further includes the following modules.

A clock signal drive module 424 is adapted to output the clock signal in the differential signaling form respectively to a clock signal input of each boundary scan device connected between the scan signal output and the scan signal input.

A status control signal drive module 426 is adapted to output the status control signal in the differential signaling form respectively to a status control signal input of each boundary scan device connected between the scan signal output and the scan signal input.

Figure 6:
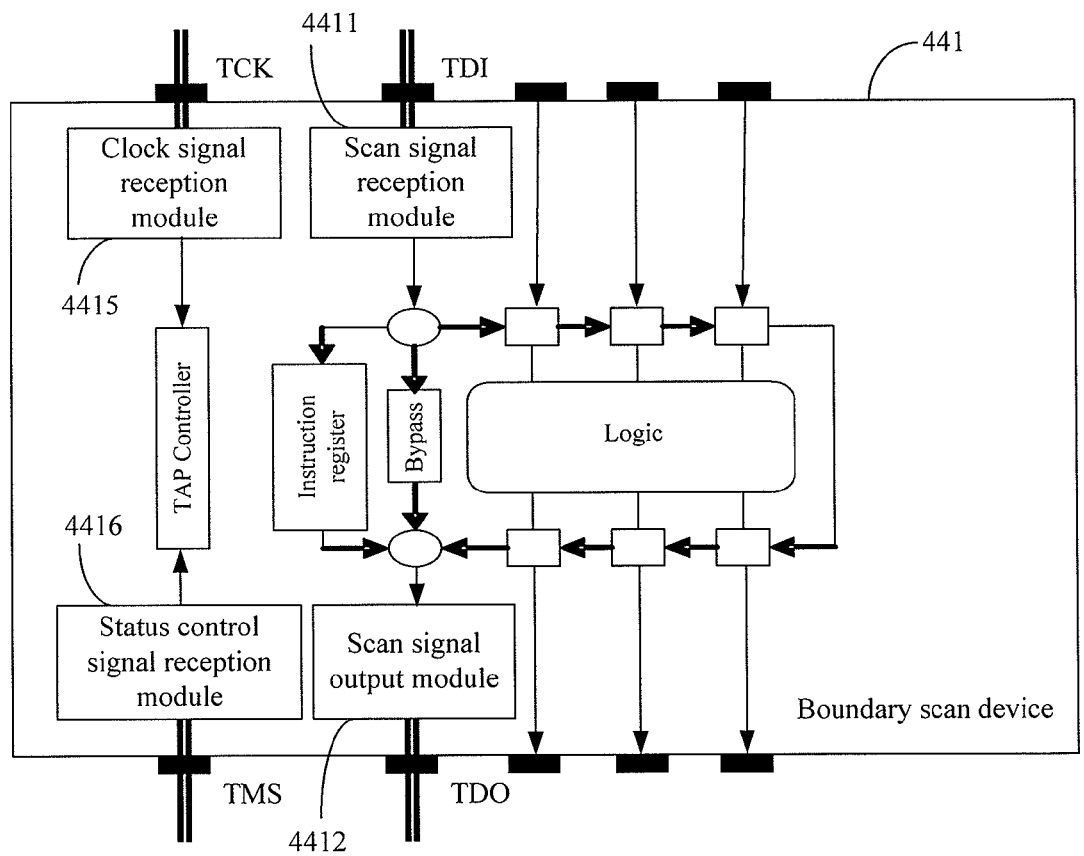
FIG. 6 illustrates a block diagram of the structure of a boundary scan device according to an embodiment of the invention.

Referring to FIG. 6, it illustrates a block diagram of the structure of a boundary scan device 441 according to an embodiment of the invention, which generally includes the following modules.

A scan signal reception module 4411 arranged at a scan signal input of the boundary scan device is adapted to convert received differential boundary scan signals into unipolarity boundary scan signals and input the converted signals into a boundary scan chain inside the boundary scan device 441.

A scan signal output module 4412 arranged at a scan signal output of the boundary scan device 441 is adapted to transmit the unipolarity boundary scan signals which have finished the scan of the boundary scan chain to the next scan signal input in the differential signaling form.

Preferably, the boundary scan device further includes the following modules.

A clock signal reception module 4415 arranged at a clock signal input of the boundary scan device 441 is adapted to convert a received clock signal in the differential signaling form into a unipolarity clock signal and input the converted signal to an internal circuit of the boundary scan device 441.

A status control signal reception module 4416 arranged at a status control signal input of the boundary scan device 441 is adapted to convert a received status control signal in the differential signaling form into a unipolarity status control signal and input the converted signal to the internal circuit of the boundary scan device 441.

The embodiments of the invention can be applicable to both a single board-level boundary scan and a system-level boundary scan.

In the above embodiments of the invention, the boundary scan signals, clock signals and status control signals are transmitted in the differential signaling form between the respective components of the boundary scan system, and since differential signaling is anti-interference high-speed signaling, the use of the invention can reduce greatly an influence of interference on the boundary scan and improve the speed of the boundary scan, thereby improving the efficiency of programming, diagnosing and testing the boundary scan device (s).

The invention has been described merely by way of the preferred embodiments thereof and those skilled in the art can modify and vary the invention without departing from the spirit and scope of the invention. Accordingly, the invention is intended to encompass these modifications and variations provided that they come into the scope of the claims appended to the invention and their equivalents.

What is claimed is:

1. A boundary scan method, comprising:
generating a first parallel unipolarity boundary scan signal, by a scan signal generation apparatus;
sending the first parallel unipolarity boundary scan signal to a boundary scan controller;
converting, by the boundary scan controller, the first parallel unipolarity boundary scan signal into a serial differential boundary scan signal; and
scanning at least one boundary scan device connected between a scan signal output and a scan signal input of the boundary scan controller by using the serial differential boundary scan signal; wherein the scanning process comprises:
converting by the boundary scan device the serial differential boundary scan signal into a unipolarity boundary scan signal, transmitting the unipolarity boundary scan signal to a boundary scan chain of the boundary scan device, and converting the unipolarity boundary scan signal into a differential boundary scan signal and transmitting the differential boundary scan signal to a next boundary scan device or to the boundary scan controller.

2. The method according to claim 1, further comprising:
converting, by the boundary scan controller, the serial differential boundary scan signal returned from the scan signal input into a second parallel unipolarity boundary scan signal and sends the second parallel unipolarity boundary scan signal to the scan signal generation apparatus.

3. The method according to claim 1, wherein the boundary scan controller generates a clock signal and a status control signal while converting the first parallel boundary scan signals generated by the scan signal generation apparatus.

4. The method according to claim 3, wherein the boundary scan controller outputs the clock signal in a differential signaling form to a clock signal input of the boundary scan device connected sequentially between the scan signal output and the scan signal input of the boundary scan controller, and the boundary scan device converts the clock signal in the differential signaling form into a unipolarity clock signal.

5. The method according to claim 3, wherein the boundary scan controller outputs the status control signal in a differential signaling form to a status control signal input of the boundary scan device connected sequentially between the scan signal output and the scan signal input of the boundary scan controller, and the boundary scan device converts the status control signal in the differential signaling form into a unipolarity status control signal.

6. A boundary scan system, comprising:
a scan signal generation apparatus configured to generate a first parallel unipolarity boundary scan signal; and
a boundary scan controller configured to convert the first parallel unipolarity boundary scan signal into a serial differential boundary scan signal, and scan at least one boundary scan device connected between a scan signal output and a scan signal input of the boundary scan controller by using the serial differential scan signal, wherein the boundary scan device is configured to convert the serial differential boundary scan signal into a serial unipolarity boundary scan signal, transmit the serial unipolarity boundary scan signal to a boundary scan chain of the boundary scan device, and convert the serial unipolarity boundary scan signal into a serial differential boundary scan signal and transmit the serial differential scan signal.

7. The system according to claim 6, wherein the boundary scan controller further converts a boundary scan signal returned from the scan signal input into a second parallel unipolarity boundary scan signal and sends the second parallel unipolarity boundary scan signal to the scan signal generation apparatus.

8. The system according to claim 6, wherein the boundary scan controller generates a clock signal and a status control signal while converting the first parallel boundary scan signals generated by the scan signal generation apparatus.

9. The system according to claim 8, wherein the boundary scan controller outputs a clock signal in a differential signaling form to a clock signal input of the boundary scan device connected between the scan signal output and the scan signal input of the boundary scan controller; and
the boundary scan device converts the clock signal in the differential signaling form into a unipolarity clock signal.

10. The system according to claim 8, wherein the boundary scan controller outputs the status control signal in a differential signaling form to a status control signal input of the boundary scan device connected between the scan signal output and the scan signal input of the boundary scan controller; and
the boundary scan device converts the differential status control signal into a unipolarity status control signal.

11. A boundary scan device, comprising:
a scan signal reception module, arranged at a scan signal input of the boundary scan device, configured to convert a differential boundary scan signal into a unipolarity boundary scan signal and transmit the unipolarity boundary scan signal to a boundary scan chain of the boundary scan device for scanning the boundary scan chain; and
a scan signal output module, arranged at a scan signal output of the boundary scan device, configured to transmit the unipolarity boundary scan signal which has finished the scan of the boundary scan chain to the next scan signal input in the differential signaling form.

12. The boundary scan device according to claim 11, wherein further comprising:
a clock signal reception module, arranged at a clock signal input of the boundary scan device, configured to convert a differential clock signal into a unipolarity clock signal and transmit the unipolarity clock signal to an internal circuit of the boundary scan device; and
a status control signal reception module, arranged at a status control signal input of the boundary scan device, configured to convert a differential status control signal into a unipolarity status control signal and transmit the unipolarity status control signal to the internal circuit of the boundary scan device.

* * * * *